United States Patent
Guo et al.

(10) Patent No.: US 6,282,146 B1
(45) Date of Patent: *Aug. 28, 2001

(54) DUAL SUPPLY VOLTAGE INPUT/OUTPUT BUFFER

(75) Inventors: Frank Tzen-Wen Guo, Danville; Sathyanandan Rajivan, San Jose; Yat Fai Lam, Milpitas; Tzu-Chien Hung, Cupertino, all of CA (US)

(73) Assignee: Rise Technology, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/336,939

(22) Filed: Jun. 21, 1999

(51) Int. Cl.[7] ..................................................... G11C 8/00
(52) U.S. Cl. ........................................ 365/230.06; 316/80
(58) Field of Search ............................... 326/81; 365/226, 365/230.06

(56) References Cited

U.S. PATENT DOCUMENTS

| 5,455,526 | * | 10/1995 | Runas | 326/81 |
| 5,598,122 | * | 1/1997 | McClure | 327/538 |
| 5,684,415 | * | 11/1997 | McManus | 326/81 |
| 5,698,993 | * | 12/1997 | Chow | 326/81 |
| 5,821,800 | * | 10/1998 | Le et al. | 3327/333 |

* cited by examiner

Primary Examiner—David Nelms
Assistant Examiner—M. Tran
(74) Attorney, Agent, or Firm—Oblon, Spivak, McClelland, Maier & Neustadt, P.C.

(57) ABSTRACT

The present invention discloses a voltage shifter capable of interfacing between two circuitry each is operating in different voltage range. The voltage shifter comprises an input buffer for converting an external input signal switching within a high voltage range to an internal input signal switching within a low voltage range, an output driver for converting an internal output signal switching within the low voltage range to an external output signal switching within the high voltage range; and a reference voltage generator for generating a reference voltage to the input buffer and the output driver. In addition, the voltage shifter is designed such that each of the transistors within is protected against voltage breakdown so that the voltage shifter can be built by transistors using the low voltage process.

14 Claims, 5 Drawing Sheets

DUAL SUPPLY VOLTAGE INPUT/OUTPUT BUFFER

BACKGROUND OF THE INVENTION

The present invention relates to a voltage level shifter, and more particularly to a dual supply voltage input/out buffer capable of interfacing between two circuitry having different voltage swings.

Integrated circuits are becoming more dense as the dimensions of semiconductor devices decrease. The decreased dimensions also provide for faster devices that require less power to operate. In particular, semiconductor devices, such as transistors, operate on less voltage than the previous generation designs. At the beginning, 5 V power supply was commonly used. In the past few years, 3.3 V power supply has been replacing 5 V power supply as the dominant design. Recently, a move to 1.8 V power supply has been popularized among low power and high speed circuit designers.

One benefit of having lower operating voltage, and consequently lower power consumption, is that demands on the power supply is decreased. This is especially important where the portability of an electronic device incorporating these semiconductor devices is desired. Thus, applications may arise where both low and high voltage integrated circuits are connected together. An integrated circuit operating on a lower voltage must then provide an output at the higher voltage. Simply utilizing the high voltage in the low voltage integrated circuit is not practical. The structural integrity of the thin film oxide will suffer if exposed to voltage potentials in excess of the maximum rated supply, typically about 10% above the normal rated voltage. For example, a 3.7 V drop from the gate to the drain, source, or substrate will tend to break down the thin oxide manufactured by a 3.3 V process. A long term reliability issue will result, with the oxide breakdown eventually causing catastrophic damage to the transistor.

A specific concern of the above problems exist for 3.3 V drivers for 1.8 V process. Although various circuit design methods have been employed to allow 1.8 V devices to be built in 1.8 V processes that are tolerant of an incoming 3.3 V signal, true 3.3 V output drivers in a 1.8 process are sometimes required.

SUMMARY OF THE INVENTION

It is therefore the object of this invention to provide a voltage shifter that is capable of interfacing between two circuitry running within different voltage ranges.

It is another object of this invention to construct a voltage shifter using low voltage process capable of handling high voltage signals.

The present invention discloses a voltage shifter comprises of an input buffer for converting an external input signal switching within a high voltage range to an internal input signal switching within a low voltage range, an output driver for converting an internal output signal switching with the low voltage range to an external output signal switching within the high voltage range; and a reference voltage generator for generating a reference voltage to the input buffer and the output driver.

The voltage shifter according to the present invention is designed such that each of the transistors within is protected against voltage breakdown so that the voltage shifter can be built by transistors using the low voltage process.

Additional objects, features and advantages of various aspects of the present invention will become apparent from the following description of its preferred embodiments, which description should be taken in conjunction with the accompanying drawings.

DETAILED DESCRIPTION OF THE DRAWINGS

The voltage shifter of the present invention is used as an interface for converting input/output signals between an internal circuitry having a low voltage swing and an external circuitry having a high voltage swing.

According to one aspect of the present invention, the voltage shifter is provided with an external input signal switching within a high voltage range. The voltage shifter converts the external input signal to an internal input signal switching within a low voltage range. In addition, the voltage shifter can also be provided with an internal output signal switching within a low voltage range, and then converts the internal output signal to an external output signal switching within the high voltage range. It should be noted that the voltage shifter of the present invention is built with integrated circuits using the low voltage process. Thus, all the critical transistors of the voltage shifter are protected from voltage breakdown so that the voltage differences across each transistor does not exceed the breakdown voltage of the low voltage process.

Furthermore, as it will be described in detail in the following paragraphs, the voltage shifter of the present invention is designed to accommodate different high voltage ranges and low voltage ranges without significantly changing the circuit design. By simply adjusting the voltage level of a reference voltage and some minor design modifications, the present invention can accommodate different output voltages and circuit processing parameters.

Figure 1:
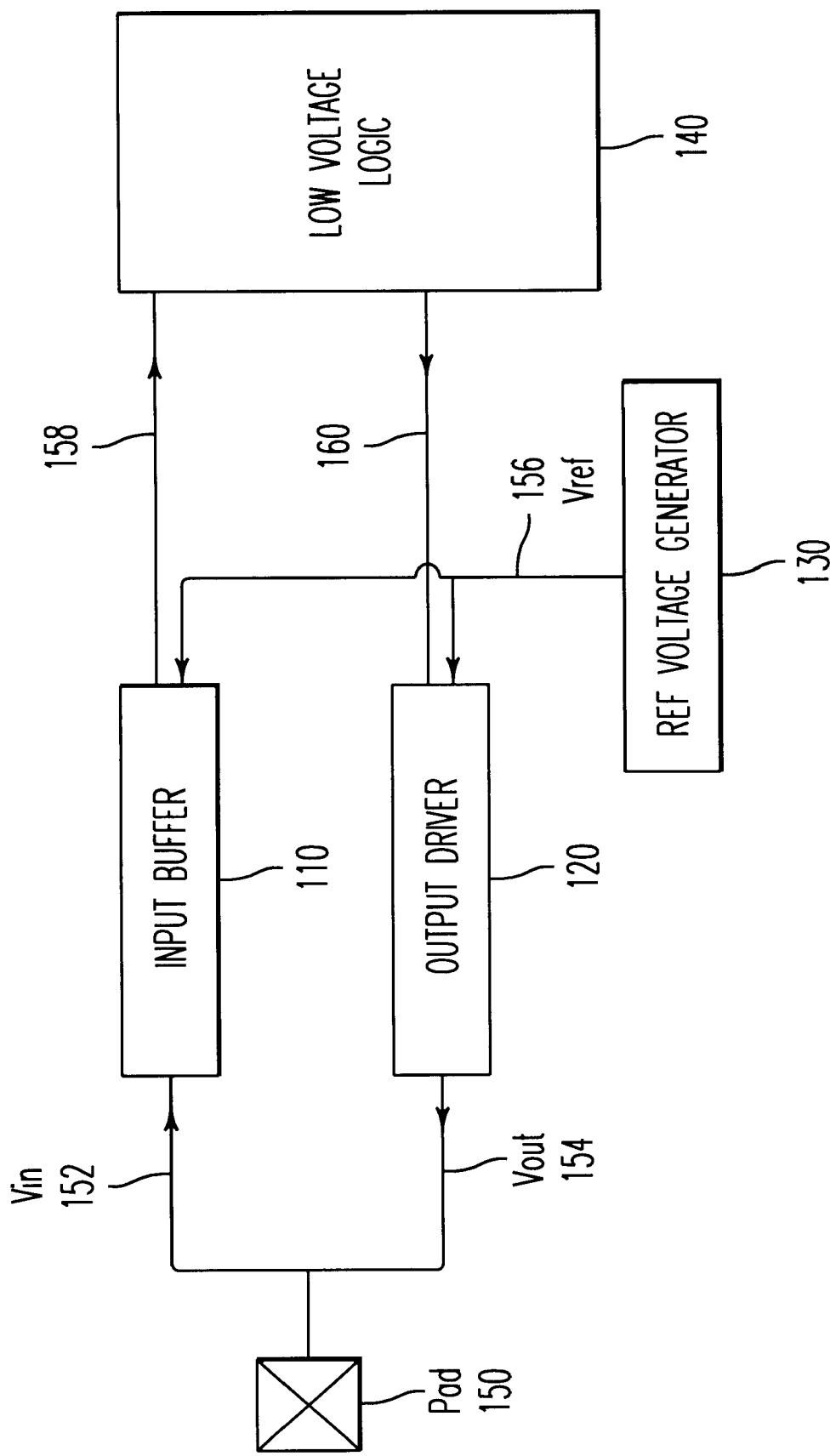
FIG. 1 shows a preferred embodiment of a voltage shifter according to the present invention.

Referring to FIG. 1, the voltage shifter according to the present invention comprises three portions: an input portion 110 for shifting an external input signal 152 switching within a higher voltage range to an internal input signal 158 switching in a low voltage range, an output portion 120 for shifting an internal output signal 160 switching within the low voltage range to an external output voltage 154 switching within the high voltage range for driving the output line; and a reference voltage generator 130 for providing a reference voltage 156 to various transistors of the voltage shifter so that the voltage differences across all the transistors used in the voltage shifter do not exceed the breakdown voltage.

Figure 2:
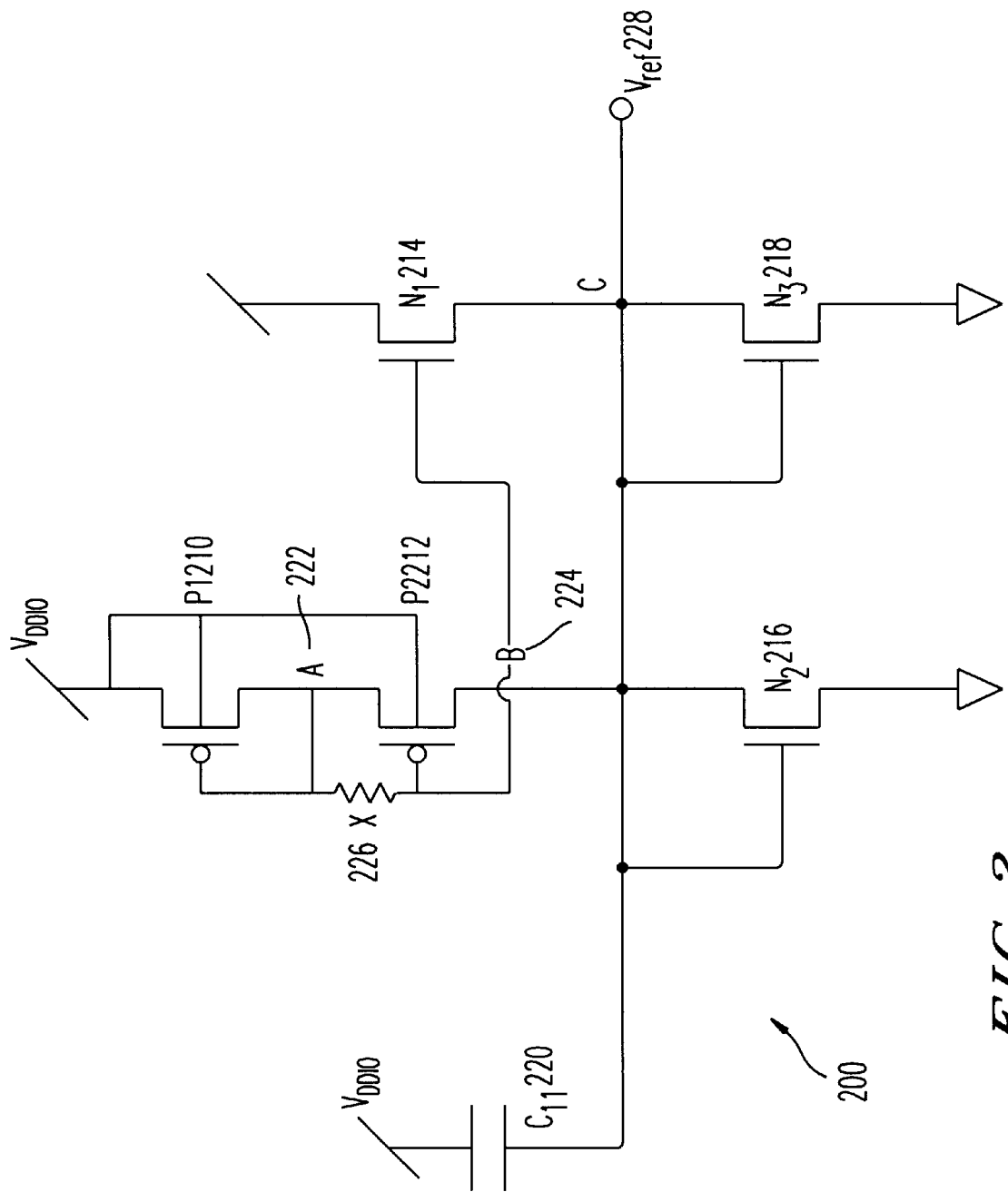
FIG. 2 shows a preferred embodiment of a reference voltage generator according to the present invention.

FIG. 2 shows a reference voltage generator 200 of a preferred embodiment according to the present invention. It should be noted that the voltage generator 200 as shown is designed to generate different reference voltages to accommodate different voltage requirements.

One of the characteristics of the reference voltage generator 200 as shown in FIG. 2 is the two serially connected PMOS transistors P1 210 and P2 212. These two PMOS transistors P1 210, P2 212 are designed as shown for their flexibility in changing the voltage level of the reference voltage 228. By changing the number of the gate-source voltage drop (i.e. $V_{gs}$) of these two transistors P1 210, P2 212 combination, two different reference voltages can be generated. Particularly, assuming $V_{ddIO}$ is 3.3 volts, when line "X" 226 is connected, the circuit as shown will generate a reference voltage for an internal 1.8 V process. On the other hand, when line "X" 226 is removed, the circuit as shown will provide an appropriate reference voltage for an internal 2.5 V process.

The following calculation shows the generation of the two different voltage levels of the reference voltage. For illustration purposes, $V_{ddIO}$ (i.e. high voltage of the external I/O power supply) is again assumed to be 3.3 volts.

In the 1.8 V process, line "X" 226 is connected. The voltage at points A 222 and B 224 equals to the source-gate voltage drop of P1 210 (i.e. $V_{ddIO}-V_{tp1}$, where $V_{tp1}$, is the threshold voltage of P1 210). Therefore, the output reference voltage $V_{ref}$, equals to the voltage of point B minus the threshold voltage of NMOS N1 214 (i.e. $V_{ddIO}-V_{tp1}-V_{tp2}$, where $V_{tp2}$, is the threshold voltage of N1 214). By adjusting the sizes of the transistors P1, P2 and N2, the required reference voltage can be produced accordingly.

For the 2.5 V process, line "X" 226 is disconnected. In this case, the voltage at point B equals to $V_{ddIO}$ minus the source-gate voltage drops of both P1 210 and P2 212 (i.e. $V_{ddIO}-V_{tp1}-V_{tp2}$, where $V_{tp2}$, is the threshold voltage of P2 212). Therefore, the output reference voltage 228 equals to $(V_{ddIO}-V_{tp1}-V_{tp2}-V_{tn1})$. Similarly, by adjusting the sizes of transistors P1 210, P2 212 and N2 216, the reference voltage 228 for the 2.5 V process can be controlled accordingly. It should be noted that capacitor $C_{11}$ 220 simply acts as an low pass filter to stabilize the circuit.

Figure 3:
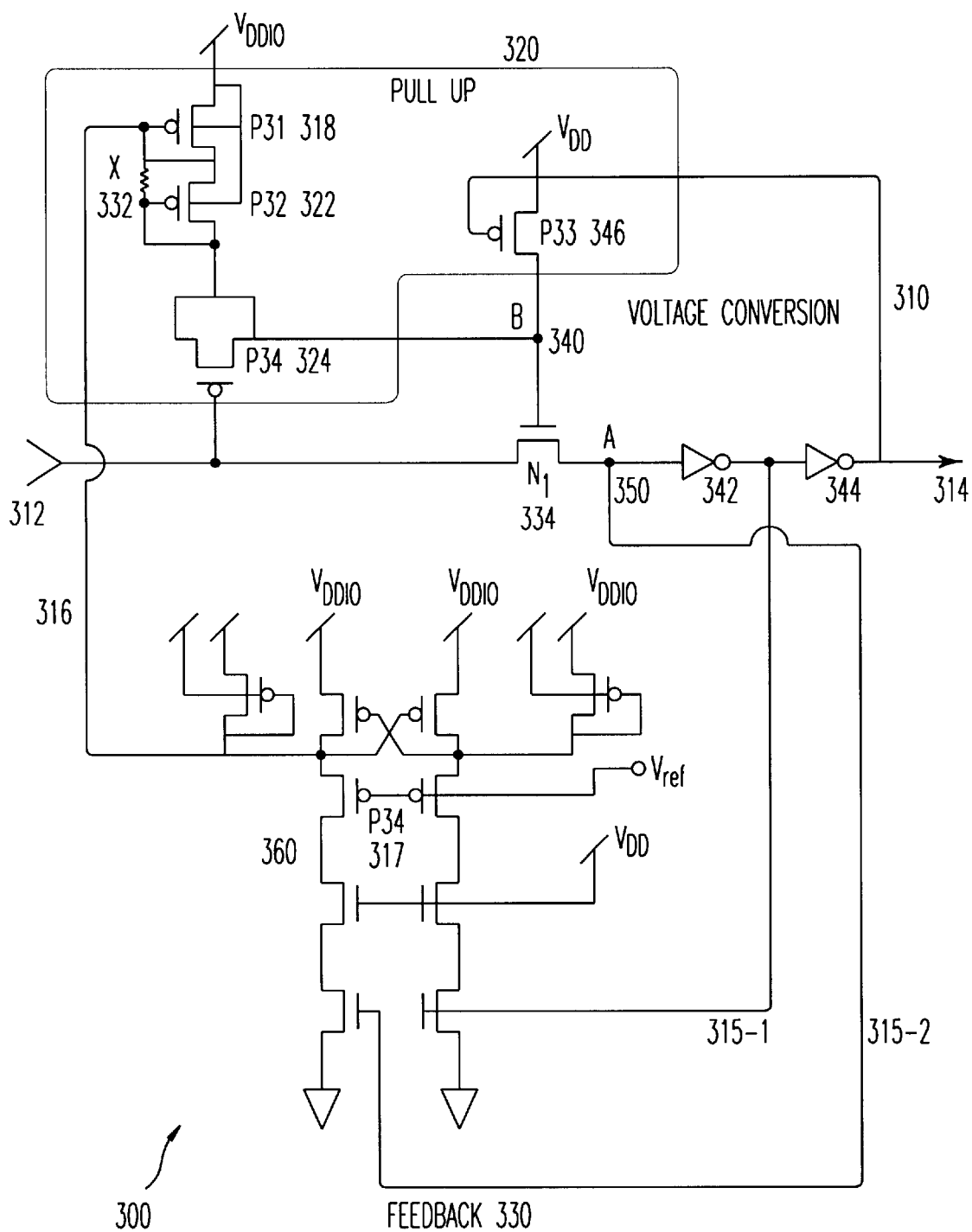
FIG. 3 shows a preferred embodiment of an input buffer according to the present invention.

FIG. 3 shows a preferred embodiment of the input buffer 300 according to the present invention.

Referring to FIG. 3, the input buffer 300 comprises three sections: a voltage conversion section 310 for converting an external input signal 312 switching within the high voltage range to an internal input signal 314 switching within the low voltage range, a pull-up circuit 320 for settling the voltage at node B 340, which is the gate voltage of N1 334; and a feedback circuit 330 for providing a control signal 316 to the pull-up circuit 320.

The operation of the voltage conversion section 310 is as follows: when the external input voltage 312 is high (e.g. 3.3 V), the two PMOS transistors P31 318, P32 322, will be activated by the feedback signal 316 provided by the feedback circuit 330. Thus, the voltage at point B 340 will be pulled up to $Vd_{ddIO}$ minus the source gate voltage drop of P31 318 (i.e. $V_{ddIO}-V_{tp31}$, wherein $V_{tp31}$ is the threshold voltage of P31 318) (or $V_{ddIO}-V_{tp31}-V_{tp32}$ if line "X" 332 is removed, where $V_{tp32}$ is the threshold voltage of P32 322). Due to the effect of NMOS transistor N1 334, the voltage at point A 350 is then limited by NMOS transistor N1 334 to the voltage at point B 340 minus the gate-source voltage drop of N1 334 (i.e. $V_{ddIO}-V_{tp2}-V_{tn1}$, where $V_{tn1}$, is the threshold voltage of N1 334) (or $V_{ddIO}-V_{tp1}-V_{tp2}-V_{tn1}$ if line "X" is removed). By limiting the voltage at point A 350, none of the transistors in the two invertors 342, 344 will exceed the breakdown voltage.

On the other hand, when the external input voltage 312 is low (e.g. 0 V), the two PMOS transistors P31 318, P32 322 will be shut off by the feedback signal 316 provided by the feedback circuit 330. However, NMOS N1 334 will be turned on by another feedback path. Specifically, the voltage at point B 340 will be pulled up by PMOS transistor P33 346 to $V_{dd}-V_{tp33}$ (where $V_{dd}$ is the internal high voltage, and $V_{tp33}$ is the threshold voltage of P33 346) so that NMOS transistor N1 334 will be turned on. Because the voltage at point B 334 equals $(V_{dd}-V_{tp33})$, the voltage across the NMOS N1 334 will not exceed the breakdown voltage.

PMOS P34 324 act as a capacitor. By coupling external input signal 312 to node B 340 through the capacitor PMOS P34 324, it speeds up switching of node B 340. Node B voltage will follow the voltage movement of external input signal 312, which provides fast and correct level changes of node B 340 for transistor N1. The node B 340 level will be eventually settled through the feedback control.

Therefore, none of the transistors will exceed the breakdown voltage during either state of the input (i.e. 3.3 V or 0 V).

As shown in the figure, the feedback circuit comprises a level shifter converter 360 to convert a pair of feedback signals 315-1,315-2 switching within the low voltage range, i.e. 0V or $V_{dd}$, to the feedback signal 316 switching within the high voltage range, i.e. $V_{ddIO}$ to $V_{ref}-V_{tp34}$. It should be noted that the design of this level shifter 360 will be discussed in detail in the following paragraphs.

In addition, as shown in the figure, the pull-up section 320 comprises two serially connected PMOS transistors (i.e. P31 318, P32 322) as used in the reference voltage generator 200 as shown in FIG. 2. By using the two PMOS transistors P31 318, P32 322 similar to the two PMOS transistors P1 210, P2 212 as shown in FIG. 2, the input buffer 300 of the current design can be adjusted to accommodate different combinations of external high voltage swings and internal low voltage swings (i.e., 3.3 V level shifting to 2.5 V or 1.8 V, or 2.5 V level shifting to 1.8 V or 1.5 V, and so on).

Figure 4:
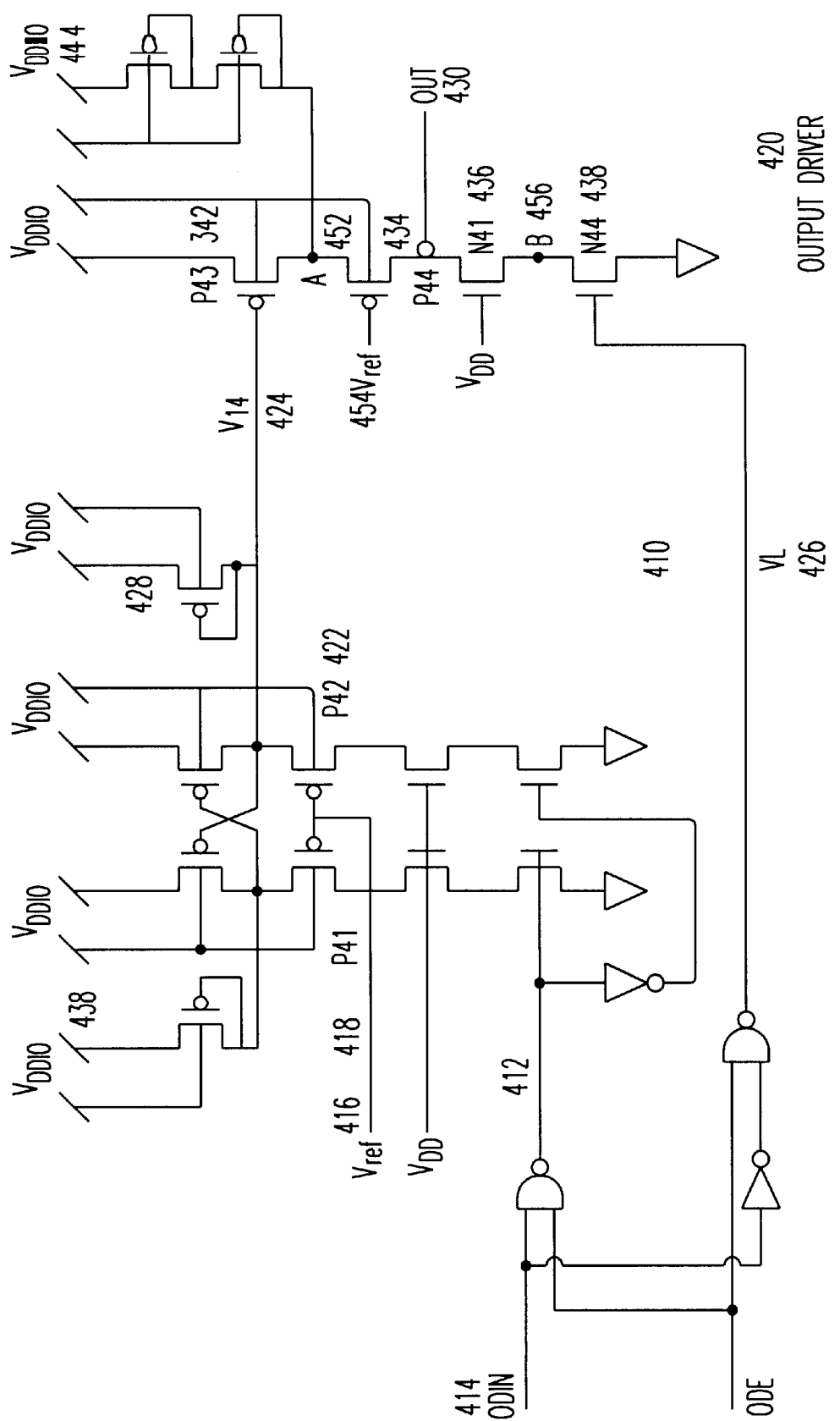
FIG. 4 shows a preferred embodiment of an output driver according to the present invention.

FIG. 4 shows a preferred embodiment of an output driver 400 according to the present invention. The output driver 400 as shown comprises a level shifter portion 410 as discussed in previous paragraphs, and an output driving portion 420 for driving signals swinging within the high voltage range, where each of these portions has a leaker device, 428, 438, and 444 respectively, to prevent the node where they attach from floating. Specifically, the output driver 400 shifts an internal output signal 414 swinging within the low voltage range to an external output signal 430 swinging in the high voltage range. Because of the present voltage shifter design and the use of the reference voltage 416 connected to the gates of the two PMOS P41 418, P42 422, none of the voltages across the three terminals of each transistors in the level shifter 410 will exceed the breakdown voltage.

In the output driver portion, when the voltage at $V_H$ 424 and $V_L$ 426 are high, the output driving portion 420 outputs a low output signal because PMOS transistor P43 432 is turned off and NMOS transistor N44 438 is turned on. Since the voltage level at $V_H$ 424 is $V_{ref}-V_{tp}$, and voltage at A 452 is not lower than $V_{ref}-V_{tp44}$, where $V_{tp44}$ is the threshold voltage of P44 434, PMOS transistors P43 432 will not breakdown because both the gate-drain and source-drain voltages of the PMOS transistor P43 432 do not exceed the breakdown voltage. Furthermore, none of the voltages across the three terminals of PMOS transistor P44 434 exceeds the breakdown voltage also. Similarly, on the NMOS transistors side, when the voltage at $V_L$ 426 is high (i.e. $V_L$ equals to $V_{dd}$, the internal high voltage), NMOS transistor N44 438 is turned on so that the drain voltage of NMOS transistor N44 438 is zero so that none of the voltages across the three terminals of NMOS transistor N44 438 exceed NMOS breakdown voltage. In addition, none of the voltages across the three terminals of NMOS transistor N41 436 exceeds breakdown also because both the $V_{ds41}$ (i.e. drain-source voltage of N41 436) and $V_{gs41}$ (i.e. gate-source voltage of N41 436) of NMOS transistor N41 436 does not exceed the breakdown voltage. In this case, the voltage at the output 430 of the output driver 420 is low.

On the other hand, when both voltages at $V_H$ 424 and $V_L$ 426 are low, a high output voltage is generated at the output 430 of the output driver 420. In this case, PMOS transistor P43 432 is turned on and the voltage at A 452 is pulled up to high at $V_{ddIO}$. Since the reference voltage $V_{ref}$ 454 is carefully chosen in the present invention, PMOS transistor P44 434 is also turned on and the voltage at point OUT 430 will be pulled up to high at $V_{ddIO}$, and the voltages across the three terminals of these two PMOS transistors P43 432, P44 434 do not exceed the breakdown voltage. On the NMOS transistors side, NMOS transistor N44 438 is turned off because $V_L$ 426 is low. In addition, NMOS transistor N41 436 clamps the voltage at B 456, taking it no lower than $V_{dd}-V_{tn41}$ where $V_{tn41}$ is the threshold voltage of N 41 436.

Figure 5:
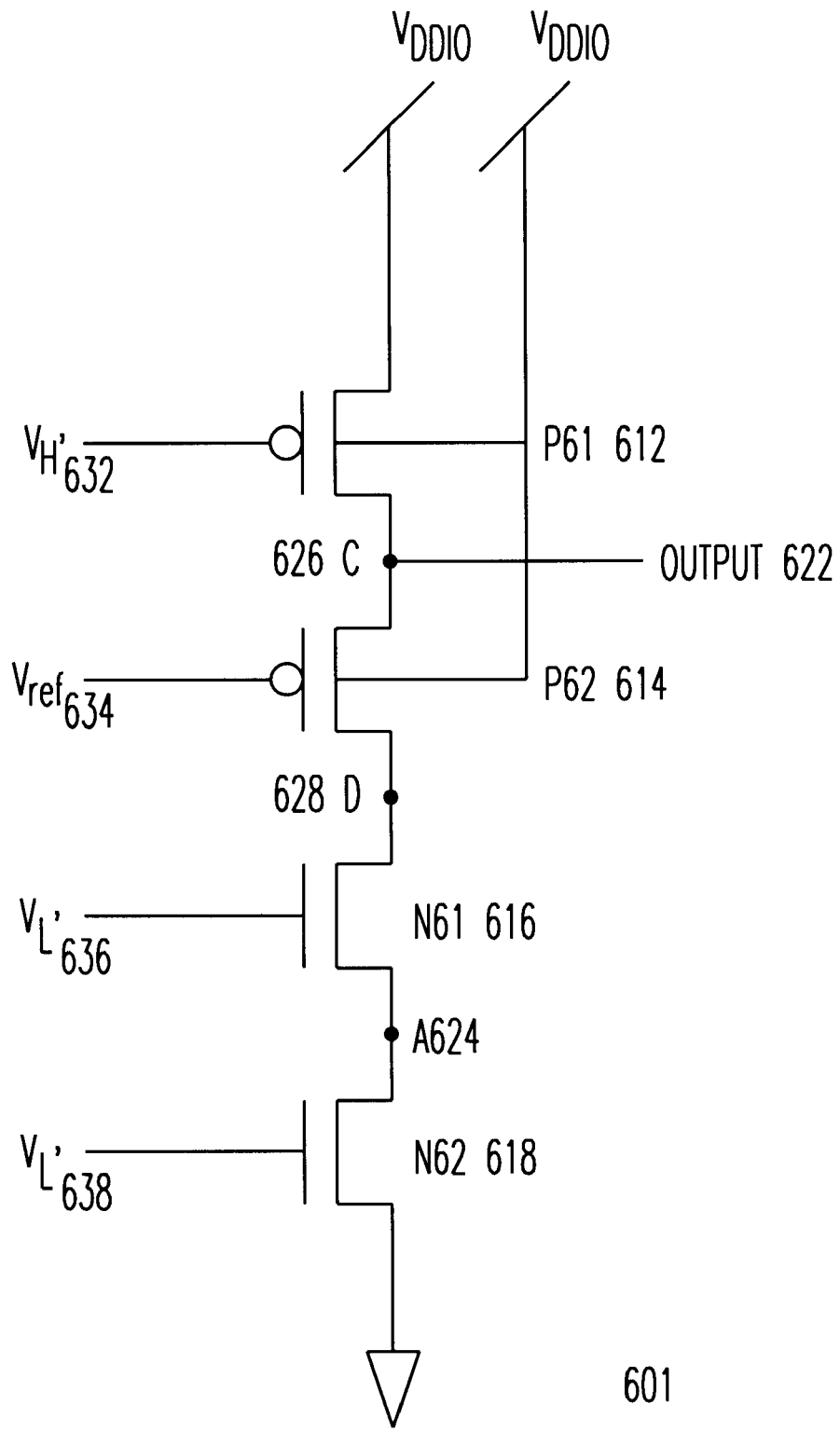
FIG. 5 shows a preferred embodiment of one half of a level shifter used in the input buffer and the output driver according to the present invention.

FIG. 5 shows a preferred embodiment of one half of the level shifter used in the input buffer 110 and the output driver 120 according to the present invention. It should be noted the level shifter can be designed for different high/low voltage combinations such that present dual voltage input/output buffer design can be adapted to different high/low voltage combinations. Specifically, the present invention can be designed for different high/low voltages such as: (1) 3.3V/2.5V; (2) 3.3V/1.8V; (3) 2.5V/1.8V; (4) 2.5V/1.5V; and (5) 2.5V/1.2V.

Since the level shifter is a symmetrical circuitry comprising two transistor chains, one of the two transistor chains is then analyzed as follows:

As shown in the figure, each of the transistor chains 610 comprises two PMOS transistors P61 612, P62 614 and two NMOS transistors N61 616, N62 618 connected in series. In the preferred embodiment as shown, the two PMOS transistors P61 612, P62 614 are used as the pull-up transistors, wherein the two NMOS transistors N61 616, N62 618 are used as the pull-down transistors. As shown in the figure, one end of the transistor chain 610 is connected to the $V_{ddIO}$ (where $V_{ddIO}$ is the high voltage of the external circuit) wherein the other end of the transistor chain 610 is connected to the ground. In the preferred embodiment as shown, the voltage at point A 624 is clamped to the high voltage of the gate of NMOS transistor N61 616 minus the voltage threshold voltage of NMOS transistor N61 616 (i.e. $V_{dd}-V_{tn}$) when $V_L'$ 638 is low (i.e. voltage is ground level) such that NMOS transistor N62 618 never breaks down. In addition, as described in previous paragraphs, $V_H'$ 632 is clamped between a high voltage of $V_{ddIO}$ and a low voltage of $V_{ref}-V_{tp}$. Because the reference voltage $V_{ref}$ 634 is applied to the gate of PMOS transistor P62 614, the voltage at point C 626 never goes below the voltage Of($V_{ref}-V_{tp}$) and the voltage at point D 628 never goes below the voltage of ($V_{dd}-V_{tp62}$, where $V_{to62}$ is the threshold voltage of P62 614). In other words, both PMOS transistors P61 612, P62 614 never break down. It should be noted that, as described above, the present invention can accommodate different input/out voltage levels with slight adjustment to the $V_{ref}$. Specifically, the present invention can be designed to work in the following voltage ranges: (1) 3.3V/2.5V; (2) 3.3V/1.8V; (3) 2.5V/1.8V; (4) 2.5V/1.5V; and (5) 2.5V/1.2V.

It is to be understood that while the invention has been described above in conjunction with preferred specific embodiments, the description and examples are intended to illustrate and not limit the scope of the invention, which is defined by the scope of the appended claims.

What is claimed is:

1. A voltage shifter, comprising:
    a reference voltage generator configured to generate a reference voltage;
    an input buffer coupled to the reference voltage generator to receive the reference voltage, and configured to receive a first signal switching within a first voltage range and to convert the first signal into a second signal switching within a second voltage range based on the reference voltage; and
    an output driver coupled to the reference voltage generator to receive the reference voltage, and configured to receive a third signal switching within a third voltage range and to convert the third signal into a fourth signal switching within a fourth voltage range based on the reference voltage, wherein
    the reference voltage generator is adjustable such that different reference voltages may be generated.

2. The voltage shifter of claim 1, wherein:
    the first voltage range is equal to the fourth voltage range; and
    the second voltage range is equal to the third voltage range.

3. The voltage shifter of claim 1 wherein:
    the first voltage range and the fourth voltage range comprise a first low voltage and a first high voltage;
    the second voltage range and the third voltage range comprise a second low voltage and a second high voltage; and
    the second high voltage is greater than the first high voltage.

4. The voltage shifter of claim 1, wherein:
    the first voltage range comprises a first low voltage level and a first high voltage level;
    the second voltage range comprises a second low voltage level and a second high voltage level; and
    the input buffer comprises,
        a NMOS transistor having a gate, a drain coupled to the first signal, and a source coupled to the second signal, and
        a gate driving circuit coupled to the gate and configured to limit a voltage of the source when the first signal is at the first high voltage level such that the voltage of the source is equal to the second high voltage level.

5. The voltage shifter of claim 4, wherein the gate driving circuit comprises a feedback circuit configured to couple the first signal to the gate through a capacitor.

6. The voltage shifter of claim 5, wherein the capacitor is a PMOS transistor.

7. The voltage shifter of claim 5, wherein the feedback circuit is configured to settle a voltage at the gate and to change the voltage at the gate based on a change in voltage of the first signal.

8. The voltage shifter of claim 7, wherein the feedback circuit is further configured to increase a switching speed of the voltage at the gate based on the change in voltage of the first signal.

9. The voltage shifter of claim 1, wherein the output driver comprises:
    a first pull up transistor having a source coupled to a voltage equal to the first high voltage level, a drain coupled to a first node, and a gate coupled to the third signal;

a second pull up transistor having a source coupled to the first node, a drain coupled to a second node, and a gate coupled to the reference voltage, the reference voltage being such that a voltage across either the first pull up transistor or the second pull up transistor does not exceed a breakdown voltage of the first pull up transistor or the second pull up transistor;

a first pull down transistor having a source coupled to a ground, a drain coupled to a third node, and a gate coupled to the third signal; and a second pull down transistor having a source coupled to the third node, a drain coupled to the second node, and a gate coupled to a second reference voltage, the second reference voltage being such that a voltage across either the first pull down transistor or the second pull down transistor does not exceed a breakdown voltage of the first pull down transistor or the second pull down transistor.

10. The voltage shifter of claim 9, wherein the third signal is provided by a level shifter.

11. The voltage shifter of claim 10, wherein:

the level shifter comprises two transistor chains configured as a differential pair to convert an input signal switching within the first voltage range into an output signal level switching within the second voltage range based on the reference voltage and the second reference voltage.

12. The voltage shifter of claim 1, wherein:

the reference voltage generator is configured to generate the reference voltage such that no transistor of the voltage shifter has a voltage that exceeds a breakdown voltage of the transistor.

13. The voltage shifter of claim 12, wherein:

the reference voltage generator is configured to generate any one of a plurality of reference voltage levels based on a selection.

14. The voltage shifter of claim 13, wherein the reference voltage generator comprises:

a first PMOS transistor coupled in series to a second PMOS transistor, and a gate of the first PMOS transistor is optionally connected to a gate of the second PMOS transistor.

* * * * *